United States Patent [19]

Kuo

[11] Patent Number: 4,547,749

[45] Date of Patent: Oct. 15, 1985

[54] VOLTAGE AND TEMPERATURE COMPENSATED FET RING OSCILLATOR

[75] Inventor: Clinton C. K. Kuo, Austin, Tex.

[73] Assignee: Motorola, Inc., Schaumburg, Ill.

[21] Appl. No.: 566,608

[22] Filed: Dec. 29, 1983

[51] Int. Cl.[4] .................. H03B 5/00; H03K 3/26; H03L 1/00; H03L 1/02

[52] U.S. Cl. .................. 331/57; 331/111; 331/117 FE; 331/176; 331/186

[58] Field of Search ............ 331/57, 62, 66, 111, 331/117 FE, 176, 186

[56] References Cited

U.S. PATENT DOCUMENTS

| | | | |
|---|---|---|---|
| 3,995,232 | 11/1976 | Laugesen | 331/111 |
| 4,015,219 | 3/1977 | Kawagoe et al. | 331/57 X |
| 4,128,816 | 12/1978 | Shimotsuma | 331/186 X |
| 4,336,466 | 6/1982 | Sud et al. | 331/111 X |
| 4,408,168 | 10/1983 | Higuchi | 331/111 X |

FOREIGN PATENT DOCUMENTS 0002255 1/1977 Japan .................. 331/57

Primary Examiner—Eugene R. LaRoche
Assistant Examiner—D. C. Mis
Attorney, Agent, or Firm—Anthony J. Sarli, Jr.; Jeffrey Van Myers; James L. Clingan, Jr.

[57] ABSTRACT

An oscillator with inverter and delay stages is coupled between first and second reference terminals. In one aspect a depletion transistor is connected between a power supply terminal and the first reference terminal to provide a reference voltage thereat. In another aspect the delay stages each have a control terminal for controlling the delay thereof. A temperature compensation circuit has a control transistor which provides a voltage to the control terminals of the delay stages which is inversely proportional to the threshold voltage of the control transistor.

6 Claims, 1 Drawing Figure

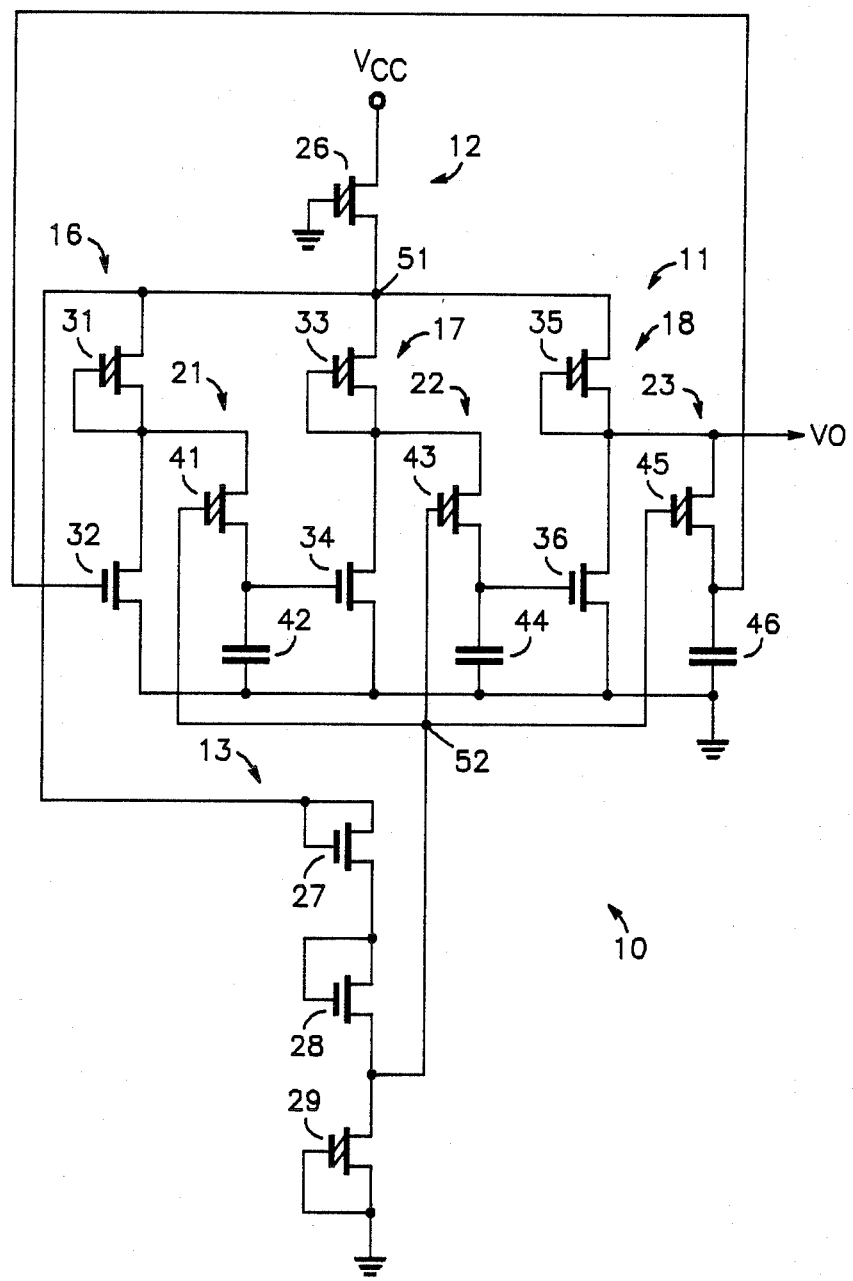

VOLTAGE AND TEMPERATURE COMPENSATED FET RING OSCILLATOR

TECHNICAL FIELD

This invention relates to oscillators, and more particularly, to oscillators which are voltage and/or temperature compensated.

BACKGROUND ART

It is typically desirable for oscillators to have frequency stability with supply voltage variation as well as temperature variation. Of course, much work has been done in providing such stability. The additional circuitry required to obtain the desired compensation can be quite extensive. Additionally, different types of oscillators have varying purposes with varying degrees of complexity for frequency stability. One oscillator use is for charge pumps. A charge pump is typically for obtaining a voltage of the opposite polarity or greater magnitude than that of the suppy voltage. An oscillator is required to drive the charge pump. Although frequency stability is important for such an application, typically circuit complexity is even more important. Consequently, compensation for temperature or supply voltage variation in order to be useful must be relatively simple.

SUMMARY OF THE INVENTION

An object of the subject invention is to provide an improved oscillator.

Another object of the invention is to provide an improved oscillator having temperature compensation.

Yet another object of the invention is to provide an improved oscillator having power supply voltage variation compensation.

These and other objects of the invention are achieved in an oscillator having inverter and delay stages coupled between first and second reference terminals. In one aspect of the invention a depletion transistor has a first current electrode coupled to a power supply terminal, a control electrode coupled to the first reference terminal, and a second current electrode coupled to the second reference terminal. In another aspect of the invention, the delay of each delay stage is controlled by a control signal. The control signal is provided by a temperature compensation circuit. The temperature compensation circuit has a control transistor which provides the control signal at a voltage which is inversely proportional to the threshold voltage of the control transistor.

BRIEF DESCRIPTION OF THE DRAWING

The sole FIGURE is a circuit diagram of an oscillator circuit according to a preferred embodiment of the invention.

DESCRIPTION OF THE INVENTION

Shown in the FIGURE is a compensated oscillator 10 comprised generally of an oscillator circuit 11, a voltage compensation circuit 12, and a temperature compensation circuit 13. Oscillator circuit 11 is comprised generally of inverters 16, 17, and 18 and RC circuits 21, 22, and 23. Voltage compensation circuit 12 is comprised of a transistor 26. Temperature compensation circuit 13 is comprised of transistors 27, 28, and 29. Inverter 16 is comprised of transistors 31 and 32. Inverter 17 is comprised of transistors 33 and 34. Inverter 18 is comprised of transistors 35 and 26. RC circuit 21 is comprised of a transistor 41 and a capacitor 42. RC circuit 22 is comprised of a transistor 43 and a capacitor 44. RC circuit 23 is comprised of a transistor 45 and a capacitor 46. All of the transistors 26, 27, 28, 29, 31, 32, 33, 34, 35, 36, 41, 43, and 45 are N channel insulated gate field effect transistors. Transistors 26, 29, 31, 33, 35, 41, 43, and 45 are preferably depletion transistors having a threshold voltage of −3.2 to −3.6 volts. Transistors 27, 28, 32, 34, and 36 are preferably enhancement transistors having a threshold voltage of 0.6 to 0.9 volt. Capacitors 42, 44, and 46 are preferably formed, in conventional fashion, from depletion transistors.

Transistor 32 has a gate as an input for inverter 16, a source connected to ground, and a drain as an output of inverter 16. Transistor 31 has a drain connected to a node 51, and a gate and source connected to the drain of transistor 32. Transistor 41 has a drain as an input of RC circuit 21 connected to the output of inverter 16, a gate connected to a node 52, and a source as an output of RC circuit 21. Capacitor 42 has a first terminal connected to the source of transistor 41, and a second terminal connected to ground. Transistor 34 has a gate as an input of inverter 17 connected to the output of RC circuit 21, a source connected to ground, and a drain as an output of inverter 17. Transistor 33 has a drain connected to node 51, and a gate and a source connected to the drain of transistor 34. Transistor 43 has a drain as an input of RC circuit 22 connected to the output of inverter 17, a gate connected to node 52, and a source as an output of RC circuit 22. Capacitor 44 has a first terminal connected to the source of transistor 43, and a second terminal connected to ground. Transistor 36 has a gate as an input of inverter 18 connected to the output of RC circuit 22, a source connected to ground, and a drain as an output of inverter 18. Transistor 35 has a drain connected to node 51, and a gate and source connected to the drain of transistor 36. Transistor 45 has a drain as an input of RC circuit 23 connected to the output of inverter 18, a gate connected to node 52, and a source as an output of RC circuit 23 connected to the input of inverter 16. Capacitor 46 has a first terminal connected to the source of transistor 45, and a second terminal connected to ground. Transistor 26 has a drain connected to a positive power supply terminal Vcc for receiving, for example, 5 volts, a gate connected to ground, and a source connected to node 51. Transistor 27 has a gate and a drain connected to node 51, and a source. Transistor 28 has a gate and a drain connected to the source of transistor 27, and a source as an output of temperature compensation circuit 13 connected to node 52. Transistor 29 has a drain connected to the source of transistor 28, and a gate and a source connected to ground.

Oscillator 11 is a conventional three stage ring oscillator which provides an output signal VO at the output of inverter 18. The frequency of signal VO is primarily determined by the gains of transistors 41, 43, and 45, the capacitance of capacitors 42, 44, and 46, and the gain of inverters 16–18. These are all a matter of design choice. Each RC circuit 21–23 establishes a delay between inverter stages 16–18 to affect the frequency. Three inverter stages with feedback ensure that oscillator 10 will oscillate. The frequency of oscillation is affected by the voltage at node 51. Transistor 26 is interposed between the power supply voltage at Vcc and node 51 to compensate for changes in voltage at Vcc. Because transistor 26 has a negative threshold voltage, transistor 26 can be conducting with a positive voltage on its source, node 51. As node 51 rises in voltage, transistor 26 will become non-conducting when node 51 reaches the magnitude of the threshold voltage of transistor 26, in this case 3.2 to 3.6 volts. The voltage at node 51 is thus primarily dependent upon the threshold voltage of transistor 26 instead of the voltage at Vcc. Although the threshold voltage of transistor 26 can vary from −3.2 to −3.6 volt over process variations, typical variation will be much less, for example, 0.2 volt variation or less. Consequently, most integrated circuits will provide a voltage at node 51 as designed. Transistor 26 is chosen to be of sufficient gain that current supplied to oscillator circuit 11 will not cause significant voltage drop across transistor 26 above that caused by threshold voltage. Transistor 26 thereby provides effective compensation for supply voltage variation with minimal increase in circuit complexity.

As temperature increases, the gain of insulated gate field effect transistors decreases. This has the effect of decreasing the frequency of oscillation. The reduction in gain of transistors 41, 43, and 45 causes the RC circuits 21–23 to provide more time delay between inverter stages. Capacitors 42, 44, and 46 are charged at a slower rate due to the increase in effective resistance of transistors 41, 43, and 45. This tends to reduce the frequency of oscillation.

Temperature compensation circuit 13 provides a higher voltage to node 52 as temperature increases to increase the conductivity of transistors 41, 43, and 45. The increase in voltage on node 52 thereby compensates for the decrease in gain of transistors 41, 43, and 45 due to temperature increase. The amount of voltage increase required can be determined, for example, by measuring the voltage at node 52 and the frequency at the lowest applicable temperature, raising the temperature to the highest applicable temperature, increasing the voltage at node 52 until the same frequency as at the lowest temperature is obtained, measuring such voltage, and taking the difference between the voltages at node 52 at the lowest and highest temperatures. Such difference is the desired increase in voltage on node 52 for temperature compensation circuit 13.

Compensation circuit 13 takes advantage of the fact that threshold voltage of insulated gate field effect transistors decreases with temperature. For a typical voltage range of 0.0° C. to 70.0° C. a typical change in threshold voltage is 0.2 volt. Transistors 27 and 28 are diode-connected so that the voltage at node 52 will be two threshold voltages below the voltage at node 51. The gain of transistor 29 is much smaller than that of transistors 27 and 28 and is present as a load to ensure that node 52 does not float to a higher voltage than desired. The voltage at node 51 also increases with temperature due to the threshold voltage of transistor 26 becoming more negative with temperature. Consequently, the voltage change at node 52 will be equal to three threshold voltage changes, in this case 3 times 0.2 which equals 0.6 volt. The change in voltage at node 52 is thus easily adjusted in increments of 0.2 volts by adding the desired number of diode-connected transistors between node 51 and 52.

In the event that the desired change in voltage at node 52 is not a multiple of 0.2 volt, transistor 29 can be increased in gain to draw more current through transistors 27 and 28. For example, if the desired voltage increase at node 52 is 0.5 volt, the gains of transistors 27, 28, and 29 are proportioned to each other so that there is current flow causing some voltage drop across transistors 27 and 28 in addition to that caused by threshold voltage. As temperature increases the voltage change at node 52 will be somewhat reduced. Another possibility is to change transistors 41, 43, and 45 to light depletion or enhancement transistors, for example, to see if a multiple of a threshold voltage change can be obtained for the desired voltage change at node 52. With modern modelling techniques, such experiments are easily run. In any event, circuit 13 is useful in compensating for temperature variation.

While the invention has been described in a preferred embodiment, it will be apparent to those skilled in the art that the disclosed invention may be modified in numerous ways and assume many embodiments other than that specifically set out and described above. Accordingly, it is intended by the appended claims to cover all modifications of the invention which fall within the true spirit and scope of the invention.

I claim:

1. In an oscillator circuit having inverter and delay stages coupled between a reference node and a first power supply terminal wherein the voltage at the reference node affects, in direct proportion, the frequency of oscillation of the oscillator circuit, a voltage compensation circuit, comprising:
    a depletion transistor having a first current electrode coupled to a second power supply terminal, a control electrode coupled to the first power supply terminal, and a second current electrode coupled to the reference node.

2. The oscillator circuit of claim 1, wherein each delay stage has a control terminal for controlling the delay thereof, further comprising a first diode-connected transistor coupled between the reference node and the control terminals of the delay stages.

3. The oscillator circuit of claim 2 further comprising a second diode-connected transistor interposed between the first diode-connected transistor and the control terminals of the delay stages.

4. The oscillator circuit of claim 3 further comprising a load coupled between the control terminals of the delay stages and the first power supply terminal.

5. In an oscillator circuit comprising:
    an inverter having an input and an output;
    delay means coupled to the output of said inverter for delaying the output of said inverter under control of a control signal; and
    feedback means coupled between said delay means and said inverter, for coupling the delayed output from said delay means to the input of said inverter;
    a temperature compensation circuit comprising:
    a first transistor having a first current electrode and a control electrode coupled to a first reference terminal, and a second current electrode;
    a second transistor having a first current electrode and a control electrode coupled to the second current electrode of the first transistor, and a second current electrode for providing the control signal to the delay means; and
    a load coupled between the second current electrode of the second transistor and a second reference terminal.

6. An oscillator circuit, comprising:
    inverter and delay stages wherein each delay stage comprises a control transistor having a first current electrode as an input of the delay stage, a second current electrode as an output of the delay stage, and a control electrode; and a capacitor having a first terminal coupled to the second current electrode of the control transistor, and a second terminal coupled to a first reference terminal;

a first transistor having a first current electrode and a control electrode coupled to a second reference terminal, and a second current electrode coupled to the control electrode of the control transistor of at least one delay stage; and a load coupled between the second current electrode of the first transistor and the first reference terminal.

* * * * *